Figure 1:
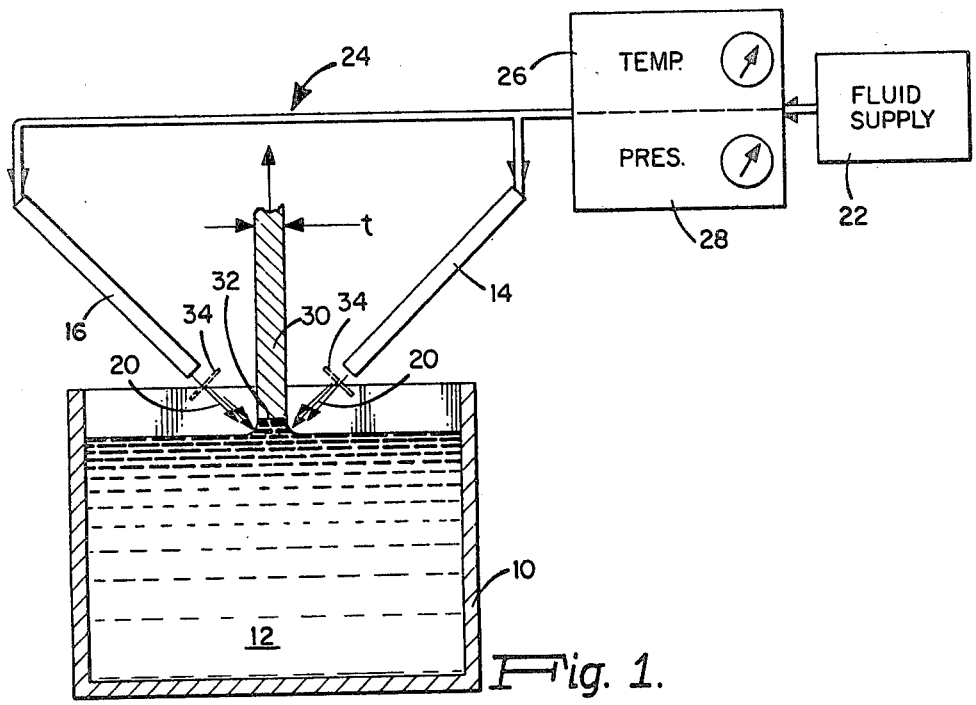

United States Patent [19]

Nowak

[11] 4,221,754
[45] Sep. 9, 1980

[54] METHOD FOR PRODUCING SOLID RIBBONS

[76] Inventor: Welville B. Nowak, 17 Furbush Ave., West Newton, Mass. 02165

[21] Appl. No.: 865,618

[22] Filed: Dec. 29, 1977

Related U.S. Application Data

[63] Continuation of Ser. No. 660,244, Feb. 23, 1976, abandoned.

[51] Int. Cl.² .................................. C04B 35/60
[52] U.S. Cl. .................... 264/164; 156/617 SP; 156/619
[58] Field of Search ............... 264/164; 156/619, 624, 156/617 SP

[56] References Cited

U.S. PATENT DOCUMENTS

| | | | |
|---|---|---|---|
| 3,053,635 | 9/1962 | Shockley | 156/617 SP |
| 3,265,469 | 8/1966 | Hall | 156/619 |
| 3,293,002 | 12/1966 | Spielmann et al. | 156/619 |

FOREIGN PATENT DOCUMENTS

| | | | |
|---|---|---|---|
| 1130414 | 5/1962 | Fed. Rep. of Germany | 156/617 SP |
| 1286510 | 9/1969 | Fed. Rep. of Germany | 156/617 SP |
| 112473 | 2/1966 | Netherlands | 156/617 SP |
| 195816 | 5/1965 | Sweden | 156/617 SP |

*Primary Examiner*—John A. Parrish
*Attorney, Agent, or Firm*—Richard J. Birch

[57] ABSTRACT

A method for producing solid ribbons is disclosed. A thin, flat "seed" is lowered into contact with and wetted by a liquid. When the seed is subsequently withdrawn from the liquid, the resulting liquid column that forms the "ribbon" is shaped by a plurality of gas jet streams directed at the base of the ribbon. The freezing interface is located above the average level of the liquid surface. The temperature and/or pressure and the number of jets can be varied to produce different ribbon configurations.

11 Claims, 2 Drawing Figures

METHOD FOR PRODUCING SOLID RIBBONS

This is a continuation of application Ser. No. 660,244, filed Feb. 23, 1976, now abandoned.

BACKGROUND OF THE INVENTION

The present invention relates to the production of solid ribbons and more particularly to a method for producing solid ribbons which utilize gas jets directed approximately at the intersection of the ribbon and the average surface level of the liquid in order to obtain the force needed to balance surface tension.

It has long been recognized that very considerable savings can be effected in the manufacture of many semiconductor devices (transistors, diodes, integrated circuits, and solar cells for the direct conversion of sunlight to electricity) if the semiconductor material could be produced in ribbon form with suitable perfection of lattice and surface. A ribbon is a long length of material whose thickness is very small compared to the width or length; in this case, thickness is meant to be about 0.004–0.012 inch, width about 1 at at least 3 inches, and a length limited by convenience.

The following references present typical techniques used to produce semiconductor (Si or Ge) ribbons. These references contain many other references.

1. "Metallurgy of Elemental and Compound Semiconductors", R. O. Grubel, editor, Vol. 12 of Metallurgical Society Conferences, Boston, Massachusetts, Aug. 1970, Interscience Publishers, N.Y.
2. U.S. Pat. No. 3,162,507 on dendritic growth by S. Dermatis.
3. J. C. Boatman and P. C. Goundry, "Process for Growth of Single Crystal Silicon Ribbon", Electrochemical Technology 5 98 (1967).
4. Don E. Swets, "Growth of Nondendritic Single Crystal Ribbons of Germanium", Electrochemical Technology 5, 385 (1967).
5. "The Growth of Crystals from Liquids", J. C. Brice, North Holland Publishing Co., 1973, p. 246.
6. R. A. Laudise et al "Crystal Growth" in Annual Review of Materials Science, Vol. 1, 1971
7. P. C. Goundry, "Method and Apparatus for Producing Crystalline Semiconductor Ribbon", U.S. Pat. No. 3,453,352, Jul. 1, 1969.
8. B. Chalmers, H. E. LaBelle, Jr., A. I. Mlavsky, Mater. Res. Bull., 6, 681 (1971).
9. B. Chalmers, H. E. LaBelle, Jr., A. I. Mlavsky, J. Cryst. Growth 13/14, 84 (1972).

Other than dendritic growth, two techniques have been used:

1. electromagnetic repulsion to shape the liquid; and,
2. an "orifice" to shape the liquid. Both techniques circumvent the tendency of surface tension to produce a circular cross-section rather than a rectangular (or ribbon) cross-section.

The difficulties with dendritic growth are the existence of the bulky dendrites on either edge of the ribbon, and the non-ideal perfection of the crystal, i.e. twins and high density of dislocations. These reduce the electrical performance of electronic devices made from them. Further, dendritic growth appears to be more critical and expensive than expected.

Electromagnetic repulsion requires large currents for the needed forces and is, therefore, energy intensive. Provision must be made to radiate or otherwise dissipate the joule heat generated in the ribbon at or near the freezing interface. Reference (1) above has a detailed review of this approach. Hence, this technique seems undesirable from a practical viewpoint.

Shaping via an "orifice" appears to be successful, although the control problems are considerable. A representative example of orifice ribbon generation is shown in U.S. Pat. No. 3,453,352. For silicon, the material of the orifice will remain a difficulty because the silicon must "wet" the orifice and silicon liquid is very reactive and "corrosive". Similarly, the die problem in the Tyco Corporation EFG process (edge-defined film-fed growth) is a difficulty (References 8 and 9).

It is accordingly a general object of the invention to provide a method for producing solid (single or polycrystalline, or non-crystalline) ribbons which circumvents the difficulties of the prior art techniques.

It is a specific object of the invention to provide a method for producing solid ribbons through the force generated by a fluid stream or streams directed at a liquid column of the ribbon material.

It is a feature of the invention that the method thereof can be practiced with relatively inexpensive "off-the-shelf" hardware.

It is another feature of the invention that the ribbon configuration can be controlled easily.

Figure 2:
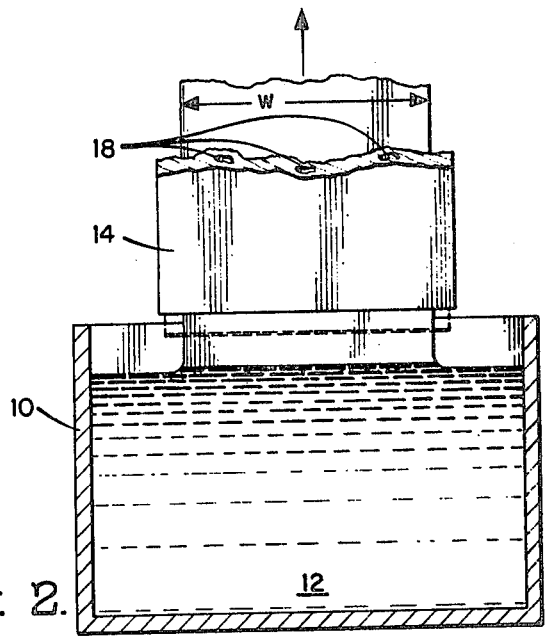

These objects and features and other objects and features will best be understood from a detailed description of a preferred embodiment of the invention selected for purposes of illustration, and shown in the accompanying drawings, in which:

FIG. 1 is a diagrammatic view in front elevation and partial section showing the formation of a solid ribbon from a liquid containing crucible through the use of fluid streams that are directed at the opposing sides of a liquid column that forms the ribbon; and, FIG. 2 is another diagrammatic view in side elevation of the ribbon forming apparatus depicted in FIG. 1.

Turning now to the drawings, the two FIGS. illustrate diagrammatically the solid ribbon forming process of the present invention. The apparatus for practicing the process comprises a crucible 10 which contains the solid ribbon material 12 in liquid form. Alternatively, the ribbon material can be dissolved in a liquid. As used herein the term "liquid phase" when applied to the ribbon material shall mean the ribbon material itself in liquid form as well as the ribbon material dissolved in another liquid. A pair of opposed fluid stream generators 14 and 16 are positioned above and at an acute angle with respect to the surface of the liquid material. Each fluid stream generator has at least one and preferably a plurality of fluid stream nozzles or jets 18 which control the direction of the fluid streams, indicated in FIG. 1 by the arrows 20. Fluid for the fluid streams 20 is obtained from a suitable supply 22. The temperature and pressure of the fluid supplied to the fluid stream generators through a piping system 24 can be varied by conventional temperature and pressure adjusting means 26 and 28, respectively.

Having briefly discussed the apparatus shown in the FIGS., I will now describe the method of producing a solid ribbon. A thin, flat "seed" is lowered to contact (and be wetted by) the liquid ribbon material in the crucible. The fluid streams are turned on by supplying liquid under pressure to the fluid stream generators 14 and 16. The fluid streams are directed approximately at the base of the ribbon 30 as shown in FIG. 1.

The seed plus liquid ribbon are pulled from the liquid 12 as in the Czochralski technique (without the rotation commonly used). The force needed to balance surface tension (and produce the ribbon shape) is obtained primarily from the action of the fluid streams impinging upon the liquid ribbon. As shown in FIG. 1, the fluid streams 20 are directed approximately at the intersection of the ribbon and the average surface level of the liquid on both sides of the ribbon.

The freezing interface 32 is located above the average level of the liquid surface. By continuing to pull the ribbon from the liquid, it is possible to produce a solid ribbon of a desired length.

In the preferred embodiment the fluid comprises a gas. The selection of a suitable gas is dictated by the ribbon material. For a silicon ribbon, one can use $H_2$ or an inert gas such as, AR or He. In other cases, one can use a reactive gas, such as $O_2$. The gas can be recycled for economy and "gettered" of $O_2$ for materials such as Si.

The fluid stream shaping or forming process of the invention permits the user to vary a number of parameters in controlling the process. For example, the following variables can be employed to control the process; superheating of the liquid material; shape and number of the fluid stream nozzles; fluid stream baffles or diffuses screens 34; the direction of the fluid stream nozzles i.e. the direction of the fluid streams themselves; the flow rate, pressure and temperature of the fluid streams; and the pulling rate of the ribbon from the melt (liquid). It will be appreciated that the use of these variables permits one to accurately control the thickness "t" and width "w" of the solid ribbon 30 as well as the horizontal, cross-sectional configuration. This configuration can be rectilinear, curved, tapered, etc.

The advantages of this process include: no "die" or orifice contamination or wear; low cost; not capital intensive; not energy intensive; susceptable to easy control; no dependency on twins for growth; and produces high quality solid ribbons, which may be single crystals.

Having described a preferred embodiment of the invention, it will now be apparent to those skilled in the art that numerous modifications can be made therein without departing from the scope of the invention as defined in the following claims. For example, the crucible can be replaced by any other means for positioning a suitable volume of a liquid. Thus, one can float one liquid on another liquid or on the end of a rod.

What I claim and desire to secure by Letters Patent of the United States is:

1. A method for producing a solid ribbon of a material from a liquid phase with said solid ribbon having a generally rectangular, transverse cross-section, said method comprising the steps of:
   a. producing a liquid phase of the ribbon material;
   b. forming from the liquid phase a liquid ribbon of said material;
   c. shaping the liquid ribbon to form a generally rectangular, transverse cross-section therein by directing fluid streams against the opposite sides of the liquid ribbon;
   d. forming a freezing interface in the liquid ribbon above the location of the liquid ribbon shaping; and
   e. withdrawing the freshly frozen ribbon so that steps b, c, and d occur continuously on new material until a desired length of solid ribbon is produced.

2. The method of claim 1 further comprising shaping the liquid ribbon by directing a plurality of fluid streams against the liquid ribbons.

3. The method of claim 1 further comprising the steps of modulating a preselected parameter of at least one of said fluid streams.

4. The method of claim 3 wherein said parameter is the temperature of the fluid stream.

5. The method of claim 3 wherein said parameter is the pressure of the fluid steam.

6. The method of claim 1 wherein said fluid is a gas.

7. The method of claim 1 wherein said ribbon material is silicon.

8. The method of claim 7 wherein said fluid is $H_2$ or an inert gas.

9. The method of claim 8 wherein the gas is an inert gas.

10. The method of claim 6 wherein the gas is a reactive gas.

11. The method of claim 8 wherein the gas is hydrogen.

* * * * *